(12) United States Patent
Uchida et al.

(10) Patent No.: US 7,741,411 B2
(45) Date of Patent: Jun. 22, 2010

(54) CARBOXYL GROUP-CONTAINING POLYURETHANE AND HEAT-CURABLE POLYURETHANE RESIN COMPOSITION

(75) Inventors: Hiroshi Uchida, Kawasaki (JP); Ritsuko Azuma, Kawasaki (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/089,500

(22) PCT Filed: Oct. 4, 2006

(86) PCT No.: PCT/JP2006/320241

§ 371 (c)(1),
(2), (4) Date: Apr. 7, 2008

(87) PCT Pub. No.: WO2007/043544

PCT Pub. Date: Apr. 19, 2007

(65) Prior Publication Data

US 2009/0156752 A1 Jun. 18, 2009

(30) Foreign Application Priority Data

Oct. 7, 2005 (JP) .............................. 2005-295275

(51) Int. Cl.
*C08F 283/04* (2006.01)
(52) U.S. Cl. .................... 525/454; 174/256; 428/423.1; 428/901; 525/528; 528/85
(58) Field of Classification Search ................. 525/403, 525/410, 454, 528; 528/85; 428/423.1, 901; 174/256
See application file for complete search history.

(56) References Cited

U.S. PATENT DOCUMENTS 5,563,206 A * 10/1996 Eicken et al. ............... 524/590

| 6,075,065 | A | 6/2000 | Yamazaki et al. | |
| 6,136,506 | A | 10/2000 | Hashimoto et al. | |
| 6,331,376 | B1 | 12/2001 | Kojima et al. | |
| 2003/0119979 | A1 * | 6/2003 | Zander et al. | 524/591 |
| 2009/0082518 | A1 * | 3/2009 | Uchida et al. | 524/539 |

FOREIGN PATENT DOCUMENTS

| EP | 0 931 802 | * | 4/2005 |
| JP | 61-103968 A | | 5/1986 |
| JP | 11-61038 A | | 3/1999 |
| JP | 2004-137370 A | | 5/2004 |
| JP | 2004-182792 A | | 7/2004 |
| KR | 10-0397008 | | 8/2003 |

OTHER PUBLICATIONS

Hill, K.; Pure Appl. Chem., 2000, vol. 72, No. 7, p. 1255-1264 [online], accessed via the Internet [retrieved on Oct. 20, 2009], URL: <http://old.iupac.org/publications/pac/2000/7207/7207pdf/7207hill_1255.pdf>.*
Database WPI Week 198627 Derwent Publications Ltd., London, GB; AN, 1986-172256, XP002415980 & JP 61-103968 A (Toyobo KK), May 22, 1986, Abstract.

* cited by examiner

*Primary Examiner*—David Wu
*Assistant Examiner*—Robert Jones, Jr.
(74) *Attorney, Agent, or Firm*—Sughrue Mion, PLLC

(57) ABSTRACT

A carboxyl group-containing polyurethane is capable of giving cured products excellent in adhesion with substrates, low warpage, flexibility, plating resistance, soldering heat resistance and long-term reliability. The carboxyl group-containing polyurethane includes a structure derived from a polyol compound having 1 to 10 hydroxyl groups and 18 to 72 carbon atoms per molecule. The carboxyl group-containing polyurethane is produced by reacting: (A) a polyisocyanate compound; (B) a polyol compound having 1 to 10 hydroxyl groups and 18 to 72 carbon atoms per molecule; and (C) a carboxyl group-containing dihydroxy compound (other than the compound (B)).

13 Claims, No Drawings

CARBOXYL GROUP-CONTAINING POLYURETHANE AND HEAT-CURABLE POLYURETHANE RESIN COMPOSITION

TECHNICAL FIELD

The present invention relates to a carboxyl group-containing polyurethane and a heat-curable polyurethane resin composition. More particularly, the invention is concerned with a carboxyl group-containing polyurethane capable of giving cured products excellent in long-term reliability, and with a heat-curable polyurethane resin composition including the polyurethane.

BACKGROUND ART

Surface protective films of flexible printed circuits are for example adhesive-bonded polyimide films, called coverlay films, that are punched out with a die conforming to the pattern, and are screen-printed films of UV or heat curable overcoating resins having flexibility, with the latter being more advantageous particularly in workability.

Known such curable overcoating resins include resin compositions based on epoxy resins, acrylic resins or mixtures thereof. These compositions are often based on resins modified by introduction of butadiene, siloxane, polycarbonate diol or long chain aliphatic skeletons, whereby the flexibility is improved and the warpage due to cure shrinkage or heat shrinkage is prevented while minimizing the reduction of heat resistance, chemical resistance and electrical insulating properties inherent to the surface protective films.

With recent weight reduction and miniaturization of electronic equipment, flexible substrates are reduced in weight and thickness and are therefore more significantly susceptible to the flexibility and cure shrinkage of the overcoating resin compositions. Consequently, the curable overcoating resins do not satisfy performance requirements in terms of flexibility and warpage due to cure shrinkage. These problems have been studied.

JP-A-H11-61038 discloses a resin composition including a polybutadiene block isocyanate and a polybutadiene polyol. Cured products of the composition have good flexibility and shrinkage factor, but are insufficient in heat resistance.

JP-A-2004-137370 discloses a polyamideimide resin produced through reaction of a polycarbonate diol and a diisocyanate compound to prepare a polyurethane having two isocyanate groups at both ends, and reaction of the diisocyanate-terminated polyurethane with trimellitic acid. Cured products of the resin have unsatisfactory long-term reliability of electrical characteristics.

JP-A-2004-182792 discloses a polyamideimide resin with an organosiloxane skeleton. Cured products of the resin have bad adhesion to substrates. This prior art uses special solvents such as N-methyl-2-pyrrolidone, which can dissolve emulsifying agents in the screen-printing, often resulting in problems.

DISCLOSURE OF INVENTION

The present invention is directed to solving the problems in the background art. It is therefore an object of the invention to provide a carboxyl group-containing polyurethane capable of giving cured products excellent in adhesion with substrates, low warpage, flexibility, plating resistance, soldering heat resistance and long-term reliability. It is another object of the invention to provide a heat-curable polyurethane resin composition including the polyurethane, and a solder resist ink including the heat-curable polyurethane resin composition.

It is a further object of the invention to provide a cured product excellent in adhesion with substrates, low warpage, flexibility, plating resistance, soldering heat resistance and long-term reliability.

The present inventors studied diligently to solve the above problems, and they have found that the problems are solved by a carboxyl group-containing polyurethane having a structure derived from a specific polyol compound. The present invention has been completed based on the finding. The present invention is concerned with the following.

[1] A carboxyl group-containing polyurethane comprising a structure derived from a polyol compound (B), the polyol compound having 1 to 10 hydroxyl groups and 18 to 72 carbon atoms per molecule.

[2] The carboxyl group-containing polyurethane as described in [1], wherein the polyol compound (B) is produced by reducing a polyvalent unsaturated fatty acid derived from an animal or vegetable oil.

[3] A carboxyl group-containing polyurethane produced by reacting:

(A) a polyisocyanate compound;

(B) a polyol compound having 1 to 10 hydroxyl groups and 18 to 72 carbon atoms per molecule; and (C) a carboxyl group-containing dihydroxy compound (other than the compound (B)).

[4] The carboxyl group-containing polyurethane as described in [3], wherein the polyurethane is produced by reacting:

the compounds (A), (B) and (C), and a monohydroxy compound (D) (other than the compound (B)) and/or a monoisocyanate compound (E).

[5] The carboxyl group-containing polyurethane as described in [3], wherein the polyisocyanate compound (A) contains at least 10 mol % relative to the total (100 mol %) thereof of an isocyanate group-containing alicyclic compound of 6 to 30 carbon atoms except the carbon atom in the isocyanate group.

[6.] The carboxyl group-containing polyurethane as described in [3], wherein the polyisocyanate compound (A) is one or a combination of two or more polyisocyanate compounds selected from the group consisting of 1,4-cyclohexane diisocyanate, isophorone diisocyanate, methylenebis(4-cyclohexyl isocyanate), hydrogenated 1,3-xylylene diisocyanate and hydrogenated 1,4-xylylene diisocyanate.

[7] The carboxyl group-containing polyurethane as described in [1] or [3], wherein the polyol compound (B) is represented by Formula (I):

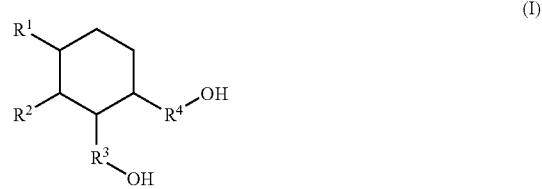

wherein $R^1$ and $R^2$ are the same or different and are each an alkyl group of 3 to 16 carbon atoms, and $R^3$ and $R^4$ are the same or different and are each an alkylene group of 3 to 16 carbon atoms.

[8] The carboxyl group-containing polyurethane as described in [3], wherein the dihydroxy compound (C) is 2,2-dimethylolpropionic acid or 2,2-dimethylolbutanoic acid.

[9] The carboxyl group-containing polyurethane as described in [3], wherein the monohydroxy compound (D) is one or a combination of two or more monohydroxy compounds selected from the group consisting of methanol, ethanol, n-propanol, isopropanol, n-butanol, isobutanol, sec-butanol and t-butanol.

[10] The carboxyl group-containing polyurethane as described in any one of [1] to [9], wherein the polyurethane has a number-average molecular weight of 1,000 to 100,000 and an acid value of 5 to 120 mg-KOH/g.

[11] The carboxyl group-containing polyurethane as described in any one of [1] to [9], wherein the polyurethane has a number-average molecular weight of 3,000 to 50,000 and an acid value of 10 to 70 mg-KOH/g.

[12] A heat-curable polyurethane resin composition comprising:

the carboxyl group-containing polyurethane of any one of [1] to [11]; and a solvent that is free of basic compounds and has a boiling point of not less than 120° C.;

the carboxyl group-containing polyurethane being dissolved in the solvent.

[13] The heat-curable polyurethane resin composition as described in [12], wherein the solvent is one or a combination of two or more solvents selected from the group consisting of toluene, xylene, ethylbenzene, nitrobenzene, isophorone, diethylene glycol dimethyl ether, ethylene glycol diethyl ether, propylene glycol methyl ether acetate, propylene glycol ethyl ether acetate, dipropylene glycol methyl ether acetate, diethylene glycol ethyl ether acetate, methyl methoxypropionate, ethyl methoxypropionate, methyl ethoxypropionate, ethyl ethoxypropionate, n-butyl acetate, isoamyl acetate, ethyl lactate, cyclohexanone, N,N-dimethylformamide, N,N-dimethylacetamide, N-methylpyrrolidone, γ-butyrolactone and dimethylsulfoxide.

[14] The heat-curable polyurethane resin composition as described in [12] or [13], wherein the solid concentration is in the range of 30 to 80% by mass.

[15] A solder resist ink comprising the heat-curable polyurethane resin composition of any one of [12] to [14], and an epoxy resin.

[16] A cured product produced by curing the solder resist ink of [15].

The carboxyl group-containing polyurethane is suitable as materials of cured products, for example cured films, that are excellent in adhesion with substrates, low warpage, flexibility, plating resistance, soldering heat resistance and long-term reliability.

The cured product produced by curing the heat-curable polyurethane resin composition, which includes the carboxyl group-containing polyurethane, is particularly excellent in long-term reliability.

The carboxyl group-containing polyurethane and the heat-curable polyurethane resin composition can produce resist inks more inexpensively than the conventional liquid polyimide inks.

Protective films from the conventional resist inks suffer warpage due to large cure shrinkage and post-curing cooling shrinkage, and consequently the yield is low. The resist ink according to the present invention enables inexpensive and efficient production of protective films that can achieve a tradeoff between the low warpage and long-term insulating reliability at high temperatures and high humidities.

BEST MODE FOR CARRYING OUT THE INVENTION

The carboxyl group-containing polyurethane and the heat-curable polyurethane resin composition according to the present invention will be described in detail hereinbelow.

[Carboxyl Group-Containing Polyurethane]

The carboxyl group-containing polyurethane of the present invention includes a structure derived from a polyol compound (B) having 1 to 10 hydroxyl groups and 18 to 72 carbon atoms per molecule. The polyol compound (B) may be produced by reducing a polyhydric unsaturated fatty acid derived from an animal or vegetable oil.

The carboxyl group-containing polyurethane may be produced by reacting:

(A) a polyisocyanate compound;

(B) a polyol compound having 1 to 10 hydroxyl groups and 18 to 72 carbon atoms per molecule;

(C) a carboxyl group-containing dihydroxy compound (other than the compound (B)); and optionally (D) a monohydroxy compound (other than the compound (B)) and/or (E) a monoisocyanate compound. These components will be described below.

(A) Polyisocyanate Compound

Examples of the polyisocyanate compounds (A) include diisocyanates such as 2,4-toluene diisocyanate, 2,6-toluene diisocyanate, isophorone diisocyanate, 1,6-hexamethylene diisocyanate, 1,3-trimethylene diisocyanate, 1,4-tetramethylene diisocyanate, 2,2,4-trimethylhexamethylene diisocyanate, 2,4,4-trimethylhexamethylene diisocyanate, 1,9-nonamethylene diisocyanate, 1,10-decamethylene diisocyanate, 1,4-cyclohexane diisocyanate, 2,2'-diethyl ether diisocyanate, diphenylmethane diisocyanate, (o, m or p)-xylene diisocyanate, methylenebis(cyclohexyl isocyanate), cyclohexane-1,3-dimethylene diisocyanate, cyclohexane-1,4-dimethylene diisocyanate, 1,5-naphthalene diisocyanate, p-phenylene diisocyanate, 3,3'-methyleneditolylene-4,4'-diisocyanate, 4,4'-diphenyl ether diisocyanate, tetrachlorophenylene diisocyanate, norbornane diisocyanate and hydrogenated (1,3- or 1,4-)xylylene diisocyanate. The polyisocyanate compounds may be used singly or in combination of two or more kinds.

The polyisocyanate compounds (A) generally have two isocyanate groups per molecule. Polyisocyanates having three or more isocyanate groups, such as triphenylmethane triisocyanate, may be used in small amounts as long as such use does not cause gelation of the polyurethane.

Of the polyisocyanate compounds, the use of alicyclic compounds of 6 to 30 carbon atoms except the carbon atom in the isocyanate group (NCO group) leads to the cured product particularly excellent in long-term insulating reliability at high temperatures and high humidities. The alicyclic compound preferably accounts for not less than 10 mol %, preferably not less than 20 mol %, more preferably not less than 30 mol % of the total of the polyisocyanate compounds (A) (100 mol %).

Preferred examples of such isocyanate group-containing alicyclic compounds include 1,4-cyclohexane diisocyanate, isophorone diisocyanate, methylenebis(4-cyclohexyl isocyanate), cyclohexane-1,3-dimethylene diisocyanate, cyclohexane-1,4-dimethylene diisocyanate and hydrogenated (1,3- or 1,4-)xylylene diisocyanate.

(B) Polyol Compound

The polyol compounds (B) in the invention have 1 to 10, preferably 2 to 4 hydroxyl groups, and 18 to 72 carbon atoms per molecule. Herein, the polyol compounds (B) are referred to as such even when there is only one hydroxyl group.

In view of the solubility of the polyurethane, it is preferable that the polyol compounds (B) be not hydrogenated. Hydrogenated polyol compounds (B) are preferable in view of the weathering resistance and electrical insulating properties of the cured product according to the invention. In view of the gelation at the production of urethane, heat resistance of the product and the like, polyol compounds (B) having hydroxyl groups at both ends are particularly preferable.

The polyol compounds' (B) are preferably produced by reducing a polyvalent unsaturated fatty acid derived from an animal or vegetable oil. The polyol compounds are preferably represented by Formula (I) below:

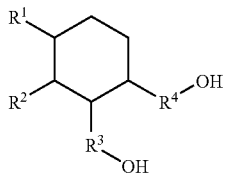

(I)

wherein $R^1$ and $R^2$ are the same or different and are each an alkyl group of 3 to 16 carbon atoms, and $R^3$ and $R^4$ are the same or different and are each an alkylene group of 3 to 16 carbon atoms.

The compounds represented by Formula (I) are diol compounds having a hydrogenated dimer acid skeleton. Commercially available such compounds include Sovermol 908 manufactured by Cognis.

In view of the solubility of the polyurethane in a solvent, polyol compounds (B) having a branched skeleton are preferred. The polyol compound having a branched skeleton desirably accounts for not less than 20 mol %, preferably not less than 30 mol %, more preferably not less than 40 mol % of the total of the polyol compounds (B) (100 mol %).

When the molecular weight of the polyol compound (B) is excessively low, the cured product often cannot show desired properties. Excessively high molecular weights can result in unfavorable properties, for example, in terms of the solubility of the polyurethane in a solvent, and the viscosity of the solution of the polyurethane in a solvent. The number-average molecular weight of the polyol compound (B) is in the range of 200 to 5,000, preferably 500 to 2,000. The molecular weight as used herein is a value in terms of polystyrene determined by GPC under conditions which will be described below.

For the purposes of improving the solubility of the polyurethane in a solvent and of improving the heat resistance of the cured product according to the present invention, polycarbonate diols, polyether polyols, polyester polyols and low molecular weight diols (other than the compound (C)) may be used in combination with the polyol compound (B) in an amount of 5 to 80 parts by weight with respect to 100 parts by weight of the polyol compound (B).

(C) Carboxyl Group-containing Dihydroxy Compound

The carboxyl group-containing dihydroxy compound (C) (other than the compound (B)) is used to introduce the carboxyl groups into the polyurethane. The use of the carboxyl group-containing dihydroxy compound (C) results in crosslinks at side chains of the polyurethane resin. Such polyurethane resin can give cured films with heat resistance higher than those obtained from resins having crosslinks at ends of molecular chains. Examples of the compounds (C) include 2,2-dimethylolpropionic acid, 2,2-dimethylolbutanoic acid, N,N-bishydroxyethylglycine and N,N-bishydroxyethylalanine. Of these, 2,2-dimethylolpropionic acid and 2,2-dimethylolbutanoic acid are particularly preferable in view of the solubility in a solvent.

The dihydroxy compounds (C) may be used singly or in combination of two or more kinds.

(D) Monohydroxy Compound and (E) Monoisocyanate Compound

The carboxyl group-containing polyurethane of the present invention may be synthesized from the aforementioned three components (A), (B) and (C). The synthesis may involve a monohydroxy compound (D) (other than the compound (B)) and/or a monoisocyanate compound (E) for the purpose of giving radical or cationic polymerizability to the polyurethane or for the purpose of eliminating the influence of the isocyanate residue or the hydroxyl group at ends of the polyurethane molecules.

Examples of the monohydroxy compounds (D) used for giving radical or cationic polymerizability to the polyurethane of the present invention include compounds having radically polymerizable double bonds, such as 2-hydroxyethyl (meth)acrylate, hydroxypropyl (meth)acrylate, hydroxybutyl (meth)acrylate, cyclohexanedimethanol mono (meth)acrylate, adducts of these (meth)acrylates with caprolactone or alkylene oxide, glycerin di(meth)acrylate, trimethylol di(meth)acrylate, pentaerythritol tri(meth)acrylate, dipentaerythritol penta(meth)acrylate, ditrimethylolpropane tri(meth)acrylate, allyl alcohol and allyloxy ethanol; and compounds having carboxylic acids, such as glycolic acid and hydroxypivalic acid.

Of the above compounds, 2-hydroxyethyl (meth)acrylate, hydroxypropyl (meth)acrylate, hydroxybutyl (meth)acrylate, allyl alcohol, glycolic acid and hydroxypivalic acid are preferred, and 2-hydroxyethyl (meth)acrylate is more preferred.

Examples of the monohydroxy compounds (D) used for eliminating the influence of the isocyanate residue at ends of the polyurethane of the present invention include the above monohydroxy compounds, methanol, ethanol, n-propanol, isopropanol, n-butanol, isobutanol, sec-butanol, t-butanol, amyl alcohol, hexyl alcohol and octyl alcohol.

Examples of the monoisocyanate compounds (E) used for giving radical or cationic polymerizability to the polyurethane of the present invention include compounds having radical double bonds such as (meth)acryloyloxyethyl isocyanate, and monoadducts of diisocyanate compounds with 2-hydroxyethyl (meth)acrylate, hydroxypropyl (meth)acrylate, hydroxybutyl (meth)acrylate, cyclohexanedimethanol mono(meth)acrylate, adducts of these (meth)acrylates with caprolactone or alkylene oxide, glycerin di(meth)acrylate, trimethylol di(meth)acrylate, pentaerythritol tri(meth)acrylate, dipentaerythritol penta(meth)acrylate, ditrimethylolpropane tri(meth)acrylate, allyl alcohol and allyloxy ethanol.

Examples of the monoisocyanate hydroxy compounds used for eliminating the influence of the terminal hydroxyl residue include phenyl isocyanate, hexyl isocyanate and dodecyl isocyanate.

The compounds (D) and/or the compounds (E) may be used singly or in combination of two or more kinds.

<Properties of Carboxyl Group-Containing Polyurethane>

The carboxyl group-containing polyurethane preferably has a number-average molecular weight (Mn) of 1,000 to 100,000, more preferably 3,000 to 50,000. The number-average molecular weight as used herein is a value in terms of polystyrene determined by gel permeation chromatography (GPC). Molecular weights less than 1,000 can result in poor elongation, flexibility and strength of the cured film obtained. When the molecular weight exceeds 100,000, the polyurethane can be less soluble in a solvent and can give an excessively viscous solution, and consequently the use can be very limited. Herein, GPC conditions are as follows unless otherwise mentioned.

(GPC Conditions)
Chromatograph: HPLC unit HSS-2000 manufactured by JASCO Corporation
Column: Shodex Column LF-804
Eluent: tetrahydrofuran
Flow rate: 1.0 ml/min
Detector: RI-2031 Plus manufactured by JASCO Corporation
Temperature: 40.0° C.
Sample size: 100 μl placed in a sample loop
Sample concentration: approximately 0.1 wt %

The carboxyl group-containing polyurethane preferably has an acid value of 5 to 120 mg-KOH/g, more preferably 10 to 70 mg-KOH/g. When the acid value is less than 5 mg-KOH/g, the reactivity with other curable resins such as epoxy resins can be lowered and the heat resistance can be deteriorated. When the acid value exceeds 120 mg-KOH/g, the cured film can be too rigid and brittle. Herein, the acid value of the resin is determined by the following method.

(Measurement of Acid Value of Resin)
Approximately 0.2 g of a sample is weighed in a 100 ml conical flask using a precision balance, and the sample is dissolved by adding 10 ml of an ethanol/toluene mixed solvent (½ by mass). One to three droplets of phenolphthalein/ethanol solution as an indicator are added to the flask, and the mixture is stirred sufficiently to uniformity. The mixture is titrated with a 0.1N potassium hydroxide/ethanol solution, and the end point of neutralization is obtained when the indicator is slightly red for 30 seconds. The results are put to the following equation to calculate the acid value of the resin.

Acid value (mg-KOH/g)=[$B \times f \times 5.611$]/$S$ wherein:
B: consumption (ml) of 0.05N potassium hydroxide/ethanol solution
f: factor of 0.05N potassium hydroxide/ethanol solution
S: amount of sample (g)

The carboxyl group-containing polyurethane preferably has a number-average molecular weight of 1,000 to 100,000 and an acid value of 5 to 120 mg-KOH/g, more preferably has a number-average molecular weight of 3,000 to 50,000 and an acid value of 10 to 70 mg-KOH/g.

<Production of Carboxyl Group-containing Polyurethane>

The carboxyl group-containing polyurethane may be synthesized by reacting the compounds (A), (B) and (C), and optionally the compound (D) and/or the compound (E) in the absence or presence of a known urethanization catalyst such as dibutyltin dilaurate, in an appropriate organic solvent. The reaction without the catalyst results in higher properties when the cured film is actually used.

The organic solvent used herein has low reactivity with isocyanates. Desirable solvents are free of basic compounds such as amines and have a boiling point of not less than 120° C., preferably not less than 200° C.

Examples of such solvents include toluene, xylene, ethylbenzene, nitrobenzene, cyclohexane, isophorone, diethylene glycol dimethyl ether, ethylene glycol diethyl ether, propylene glycol methyl ether acetate, propylene glycol ethyl ether acetate, dipropylene glycol methyl ether acetate, diethylene glycol ethyl ether acetate, methyl methoxypropionate, ethyl methoxypropionate, methyl ethoxypropionate, ethyl ethoxypropionate, ethyl acetate, n-butyl acetate, isoamyl acetate, ethyl lactate, acetone, methyl ethyl ketone, cyclohexanone, N,N-dimethylformamide, N,N-dimethylacetamide, N-methylpyrrolidone, γ-butyrolactone, dimethylsulfoxide, chloroform and methylene chloride.

Of these, propylene glycol methyl ether acetate, propylene glycol ethyl ether acetate, dipropylene glycol methyl ether acetate, diethylene glycol ethyl ether acetate and γ-butyrolactone are preferable in view of the facts that organic solvents in which the carboxyl group-containing polyurethane shows low solubility are not preferable and that the polyurethane has an application in electronic material's in which it is used as a material of inks.

The addition sequence of the materials is not particularly limited. Generally, the polyol compound (B) and dihydroxy compound (C) are fed first and dissolved in the solvent, and the polyisocyanate compound (A) is added dropwise at 20 to 150° C., preferably 60 to 120° C., and these are reacted together at 50 to 160° C., preferably 60 to 130° C.

The molar ratio of the materials is controlled depending on an objective molecular weight and acid value of the polyurethane. When the monohydroxy compound (D) is introduced in the polyurethane, it is necessary that the compound (A) be used in excess over the compounds (B) and (C) (so that the isocyanate groups are excess over the total hydroxyl groups) such that the polyurethane molecule is terminated with the isocyanate groups.

To introduce the monohydroxy compound (D) in the polyurethane, the monohydroxy compound (D) is added dropwise to the solution of the polyurethane at 20 to 150° C., more preferably 70 to 120° C. when the reaction of the polyol compound (B) and dihydroxy compound (C) with the polyisocyanate compound (A) has substantially terminated, whereby the isocyanate groups remaining at both ends of the polyurethane are reacted with the monohydroxy compound (D); thereafter the temperature is maintained constant to allow the reaction to complete.

To introduce the monoisocyanate compound (E) in the polyurethane, the monoisocyanate compound (E) is added dropwise to the solution of the polyurethane at 20 to 150° C., more preferably 70 to 120° C. when the reaction of the polyol compound (B) and dihydroxy compound (C) with the polyisocyanate compound (A) has substantially terminated, whereby the hydroxyl groups remaining at both ends of the polyurethane are reacted with the monoisocyanate compound (E); thereafter the temperature is maintained constant to allow the reaction to complete.

[Heat-curable Polyurethane Resin Composition]

The heat-curable polyurethane resin composition according to the present invention includes the carboxyl group-containing polyurethane and a solvent, and the carboxyl group-containing polyurethane is dissolved in the solvent. The organic solvents described above may be favorably used as the solvent herein.

The heat-curable polyurethane resin composition preferably has a concentration of the carboxyl group-containing polyurethane (solid concentration) of 10 to 90% by mass, more preferably 30 to 80% by mass.

The heat-curable polyurethane resin composition may be cured as follows. The composition is mixed with other heat-curable resins such as epoxy resins, curing catalysts and anti-foaming agents as required to produce a solder resist ink, and the ink is applied by screen printing or the like, followed by drying and heating.

Examples of the epoxy resins include bisphenol A epoxy resins, bisphenol F epoxy resins, phenol novolac epoxy resins, o-cresol novolac epoxy resins, biphenyl epoxy resins, polyfunctional epoxy resins, amine epoxy resins, heterocyclic epoxy resins, alicyclic epoxy resins, epoxidized polybutadienes and silicone-containing epoxy resins. These may be used singly or in combination of two or more kinds.

Commercially available bisphenol A epoxy resins include EPIKOTE series 828, 1002 and 1004 manufactured by JAPAN EPOXY RESIN CO., LTD.

Commercially available bisphenol F epoxy resins include EPIKOTE series 806, 807 and 4005P manufactured by JAPAN EPOXY RESIN CO., LTD., and YDF-170 manufactured by Tohto Kasei Co., Ltd.

Commercially available phenol novolac epoxy resins include EPIKOTE series 152 and 154 manufactured by JAPAN EPOXY RESIN CO., LTD., and EPPN-201 manufactured by NIPPON KAYAKU CO., LTD.

Commercially available o-cresol novolac epoxy resins include EOCN series 125S, 103S and 104S manufactured by NIPPON KAYAKU CO., LTD.

Commercially available biphenyl epoxy resins include EPIKOTE series YX-4000 and YL-6640 manufactured by JAPAN EPOXY RESIN CO., LTD.

Commercially available polyfunctional epoxy resins include EPIKOTE 1031S manufactured by JAPAN EPOXY RESIN CO., LTD., Araldite 0163 manufactured by Ciba Specialty Chemicals Inc., and DENACOL series EX-611, EX-614, EX-614B, EX-622, EX-512, EX-521, EX-421, EX-411 and EX-321 manufactured by Nagase Kasei Kogyo K.K.

Commercially available amine epoxy resins include EPIKOTE 604 manufactured by JAPAN EPOXY RESIN CO., LTD., YH-434 manufactured by Tohto Kasei Co., Ltd., TETRAD-X and TETRAD-C manufactured by MITSUBISHI GAS CHEMICAL COMPANY, INC., GAN manufactured by NIPPON KAYAKU CO., LTD., and ELM-120 manufactured by Sumitomo Chemical Co., Ltd.

Commercially available heterocyclic epoxy resins include Araldite PT810 manufactured by Ciba Specialty Chemicals Inc.

Commercially available alicyclic epoxy resins include EHPE 3150, EHPE 3150CE, CELLOXIDE 2000, CELLOXIDE 2021, CELLOXIDE 2081, EPOLEAD PB3600 and EPOLEAD GT401 manufactured by DAICEL CHEMICAL INDUSTRIES, LTD., and ERL series 4234, 4299, 4221 and 4206 manufactured by UCC.

Commercially available epoxidized polybutadienes include EPOLEAD PB3600 manufactured by DAICEL CHEMICAL INDUSTRIES, LTD.

Commercially available silicone-containing epoxy resins include KF-105, X-22-163A, X-22-163B, X-22-163C, X-22-169AS and X-22-169B manufactured by Shin-Etsu Chemical Co., Ltd.

Of the epoxy resins, the bisphenol A epoxy resins, bisphenol F epoxy resins, biphenyl epoxy resins and alicyclic epoxy resins are preferable in terms of mechanical properties, adhesion and flexibility. The epoxy equivalent of the epoxy resins is in the range of 120 to 20,000, preferably 150 to 2,000.

The amount of the epoxy resins is from 1 to 100 parts by weight, preferably from 5 to 50 parts by weight based on 100 parts by weight of the carboxyl group-containing polyurethane. Amounts of the epoxy resins less than 1 part by weight can lead to reduction of heat resistance, adhesion and flexibility of the cured product. When the amount exceeds 100 parts by weight, the cured product often shows reduced warpage resistance and mechanical strength.

The equivalent ratio of the epoxy groups in the epoxy resins to the acid groups in the carboxyl group-containing polyurethane is desirably in the range of 0.2 to 2, preferably 0.5 to 1.5. When the equivalent ratio is less than 0.2, the heat-curable resin composition often shows lower curability. When the ratio is above 2, the storage stability can be deteriorated.

The cured product according to the present invention is excellent in adhesion with substrates, low warpage, flexibility, plating resistance, soldering heat resistance and long-term reliability.

EXAMPLES

The present invention will be described by the following examples without limiting the scope of the invention.

Example 1

A reaction vessel equipped with a stirrer, a thermometer and a condenser was charged with 52.1 g of Sovermol 908 (dimer diol, manufactured by Cognis) as polyol compound, 12.7 g of 2,2-dimethylolbutanoic acid (manufactured by Nippon Kasei Chemical Co., Ltd.) as carboxyl group-containing dihydroxy compound and 120.0 g of diethylene glycol ethyl ether acetate (manufactured by DAICEL CHEMICAL INDUSTRIES, LTD.) as solvent. The materials were dissolved at 90° C. The temperature of the reaction liquid was lowered to 80° C., and 52.5 g of methylenebis(4-cyclohexyl isocyanate) [DESMODUR W manufactured by Sumika Bayer Urethane Co., Ltd.] as polyisocyanate was added dropwise with a dropping funnel over a period of 5 minutes. After the completion of the dropwise addition, reaction was performed at 80° C. for 1 hour, 90° C. for 1 hour, and 100° C. for 2 hours. When the substantial disappearance of the isocyanate was confirmed, 2.9 g of isobutanol (manufactured by Wako Pure Chemical Industries, Ltd.) was added dropwise and reaction was performed at 105° C. for 30 minutes. The carboxyl group-containing polyurethane obtained had a number-average molecular weight of 5,100 and an acid value of the solid of 39.9 mg-KOH/g.

Example 2

A reaction vessel equipped with a stirrer, a thermometer and a condenser was charged with 60.8 g of Sovermol 908 (dimer diol, manufactured by Cognis) as polyol compound, 12.3 g of 2,2-dimethylolpropionic acid (manufactured by Nippon Kasei Chemical Co., Ltd.) as carboxyl group-containing dihydroxy compound and 128.2 g of γ-butyrolactone as solvent (manufactured by Mitsubishi Chemical Corporation). The materials were dissolved at 90° C. The temperature of the reaction liquid was lowered to 80° C., and 53.1 g of DESMODUR W (manufactured by Sumika Bayer Urethane Co., Ltd.) as polyisocyanate was added dropwise with a dropping funnel over a period of 5 minutes. After the completion of the dropwise addition, reaction was performed at 80° C. for 1 hour, 90° C. for 1 hour, and 100° C. for 2 hours. When the substantial disappearance of the isocyanate was confirmed, 2.2 g of isobutanol (manufactured by Wako Pure Chemical Industries, Ltd.) was added dropwise and reaction was performed at 105° C. for 30 minutes. The carboxyl group-containing polyurethane obtained had a number-average molecular weight of 6,200 and an acid value of the solid of 40.0 mg-KOH/g.

Example 3

A reaction vessel equipped with a stirrer, a thermometer and a condenser was charged with 53.2 g of Kuraray Polyol C-1090 (polycarbonate diol copolymer including 1,6-hexanediol and 3-methyl-1,5-pentanediol in 10:90 molar ratio, manufactured by KURARAY CO., LTD.) as polyol compound, 14.7 g of Sovermol 908 (dimer diol, manufactured by Cognis) as polyol compound, 13.2 g of 2,2-dimethylolbutanoic acid (manufactured by Nippon Kasei Chemical Co., Ltd.) as carboxyl group-containing dihydroxy compound and 122.5 g of diethylene glycol ethyl ether acetate (manufactured by DAICEL CHEMICAL INDUSTRIES, LTD.) as solvent. The materials were dissolved at 90° C. The temperature of the reaction liquid was lowered to 80° C., and 45.1 g of DESMODUR W (manufactured by Sumika Bayer Urethane Co., Ltd.) as polyisocyanate was added dropwise with a dropping funnel over a period of 5 minutes. After the completion of the dropwise addition, reaction was performed at 110° C. for 7 hours. When the substantial disappearance of the isocyanate was confirmed, 2.0 g of isobutanol (manufactured by Wako Pure Chemical Industries, Ltd.) was added dropwise and reaction was performed at 120° C. for 2 hours. The carboxyl group-containing polyurethane obtained had a number-average molecular weight of 8,700 and an acid value of the solid of 39.2 mg-KOH/g.

Example 4

A reaction vessel equipped with a stirrer, a thermometer and a condenser was charged with 53.2 g of Kuraray Polyol C-1090 (polycarbonate diol copolymer including 1,6-hexanediol and 3-methyl-1,5-pentanediol in 10:90 molar ratio, manufactured by KURARAY CO., LTD.) as polyol compound, 13.7 g of Sovermol 908 (dimer diol, manufactured by Cognis) as polyol compound, 14.4 g of 2,2-dimethylolbutanoic acid (manufactured by Nippon Kasei Chemical Co., Ltd.) as carboxyl group-containing dihydroxy compound and 136.2 g of γ-butyrolactone (manufactured by Mitsubishi Chemical Corporation) as solvent. The materials were dissolved at 90° C. The temperature of the reaction liquid was lowered to 80° C., and 36.5 g of 1,3-hydrogenated xylylene diisocyanate (TAKENATE 600, manufactured by MITSUI TAKEDA CHEMICALS, INC.) as polyisocyanate was added dropwise with a dropping funnel over a period of 5 minutes. After the completion of the dropwise addition, reaction was performed at 90° C. for 7 hours. When the substantial disappearance of the isocyanate was confirmed, 2.0 g of isobutanol (manufactured by Wako Pure Chemical Industries, Ltd.) was added dropwise and reaction was performed at 120° C. for 2 hours. The carboxyl group-containing polyurethane obtained had a number-average molecular weight of 10,700 and an acid value of the solid of 39.8 mg-KOH/g.

Example 5

A reaction vessel equipped with a stirrer, a thermometer and a condenser was charged with 52.9 g of C-1015N [polycarbonate diol, manufactured by KURARAY CO., LTD., molar ratio of raw material diols (1,9-nonanediol:2-methyl-1,8-octanediol)=15:85] as polyol compound, 14.7 g of Sovermol 908 (dimer diol, manufactured by Cognis) as polyol compound, 12.5 g of 2,2-dimethylolbutanoic acid (manufactured by Nippon Kasei Chemical Co., Ltd.) as carboxyl group-containing dihydroxy compound and 118.3 g of γ-butyrolactone (manufactured by Mitsubishi Chemical Corporation) as solvent. The materials were dissolved at 90° C. The temperature of the reaction liquid was lowered to 80° C., and 32.2 g of COSMONATE T-80 (manufactured by MITSUI TAKEDA CHEMICALS, INC.) as polyisocyanate was added dropwise with a dropping funnel over a period of 5 minutes. After the completion of the dropwise addition, reaction was performed at 90° C. for 6 hours. When the substantial disappearance of the isocyanate was confirmed, 2.0 g of isobutanol (manufactured by Wako Pure Chemical Industries, Ltd.) was added dropwise and reaction was performed at 100° C. for 2 hours. The carboxyl group-containing polyurethane obtained had a number-average molecular weight of 9,600 and an acid value of the solid of 40.5 mg-KOH/g.

Example 6

A reaction vessel equipped with a stirrer, a thermometer and a condenser was charged with 38.6 g of C-1015N [polycarbonate diol, manufactured by KURARAY CO., LTD., molar ratio of raw material diols (1,9-nonanediol:2-methyl-1,8-octanediol)=15:85] as polyol compound, 30.7 g of Sovermol 908 (dimer diol, manufactured by Cognis) as polyol compound, 12.2 g of 2,2-dimethylolbutanoic acid (manufactured by Nippon Kasei Chemical Co., Ltd.) as carboxyl group-containing dihydroxy compound and 120.2 g of γ-butyrolactone (manufactured by Mitsubishi Chemical Corporation) as solvent. The materials were dissolved at 100° C. 43.5 g of DESMODUR W (manufactured by Sumika Bayer Urethane Co., Ltd.) as polyisocyanate was added dropwise with a dropping funnel over a period of 5 minutes. After the completion of the dropwise addition, reaction was performed at 110° C. for 7 hours. When the substantial disappearance of the isocyanate was confirmed, 2.0 g of isobutanol (manufactured by Wako Pure Chemical Industries, Ltd.) was added dropwise and reaction was performed at 120° C. for 2 hours. The carboxyl group-containing polyurethane obtained had a number-average molecular weight of 12,000 and an acid value of the solid of 39.8 mg-KOH/g.

Example 7

A reaction vessel equipped with a stirrer, a thermometer and a condenser was charged with 27.0 g of C-1015N [polycarbonate diol, manufactured by KURARAY CO., LTD., molar ratio of raw material diols (1,9-nonanediol:2-methyl-1,8-octanediol)=15:85] as polyol compound, 30.7 g of polyol compound Sovermol 908 (dimer diol, manufactured by Cognis), 12.2 g of 2,2-dimethylolbutanoic acid (manufactured by Nippon Kasei Chemical Co., Ltd.) as carboxyl group-containing dihydroxy compound and 116.6 g of γ-butyrolactone (manufactured by Mitsubishi Chemical Corporation) as solvent. The materials were dissolved at 100° C. 44.1 g of DESMODUR W (manufactured by Sumika Bayer Urethane Co., Ltd.) as polyisocyanate was added dropwise with a dropping funnel over a period of 5 minutes. After the completion of the dropwise addition, reaction was performed at 110° C. for 7 hours. When the substantial disappearance of the isocyanate was confirmed, 2.0 g of isobutanol (manufactured by Wako Pure Chemical Industries, Ltd.) was added dropwise and reaction was performed at 120° C. for 2 hours. The carboxyl group-containing polyurethane obtained had a number-average molecular weight of 11,000 and an acid value of the solid of 40.1 mg-KOH/g.

Comparative Example 1

A reaction vessel equipped with a stirrer, a thermometer and a condenser was charged with 65.5 g of PTXG-1800 (polyether copolymer including 1,4-butanediol and neopentyl glycol, manufactured by ASAHI KASEI FIBERS CORPORATION), 11.3 g of 2,2-dimethylolbutanoic acid as carboxyl group-containing dihydroxy compound and 106.3 g of diethylene glycol ethyl ether acetate as solvent. The materials were dissolved at 90° C. 29.3 g of DESMODUR W (manufactured by Sumika Bayer Urethane Co., Ltd.) as polyisocyanate was added dropwise with a dropping funnel over a period of 30 minutes. After the completion of the dropwise addition, reaction was performed at 80° C. for 1 hour, 90° C. for 1 hour, and 100° C. for 1 hour. When the substantial disappearance of the isocyanate was confirmed, 1.7 g of isobutanol (manufactured by Wako Pure Chemical Industries, Ltd.) was added dropwise and reaction was performed at 100° C. for 1.5 hours. The carboxyl group-containing polyurethane obtained had a number-average molecular weight of 9,000 and an acid value of the solid of 39.7 mg-KOH/g.

Comparative Example 2

A reaction vessel equipped with a stirrer, a thermometer and a condenser was charged with 62.5 g of Kuraray Polyol P-2030 (polyester polyol copolymer including isophthalic acid and 3-methyl-1,5-pentanediol, manufactured by KURARAY CO., LTD.), 10.4 g of 2,2-dimethylolbutanoic acid as carboxyl group-containing dihydroxy compound and 101.5 g of diethylene glycol ethyl ether acetate as solvent. The materials were dissolved at 90° C. 26.8 g of DESMODUR W (manufactured by Sumika Bayer Urethane Co., Ltd.) as polyisocyanate was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 1.5 g of isobutanol (manufactured by Wako Pure Chemical Industries, Ltd.) was added dropwise and reaction was performed at 100° C. for 30 minutes. The carboxyl group-containing polyurethane obtained had a number-average molecular weight of 10,400 and an acid value of the solid of 40.3 mg-KOH/g.

Comparative Example 3

A reaction vessel equipped with a stirrer, a thermometer and a condenser was charged with 59.9 g of PCDL T5651 (polycarbonate diol copolymer including 1,6-hexanediol and 1,5-pentanediol, manufactured by Asahi Kasei Chemicals Corporation), 50.5 g of 2,2-dimethylolbutanoic acid as carboxyl group-containing dihydroxy compound and 209.0 g of propylene glycol methyl ether acetate as solvent. The materials were dissolved at 90° C. 87.4 g of TAKENATE 600 (manufactured by MITSUI TAKEDA CHEMICALS, INC.) as polyisocyanate was added dropwise with a dropping funnel over a period of 30 minutes. After the completion of the dropwise addition, reaction was performed at 80° C. for 1 hour, 90° C. for 1 hour, and 100° C. for 1.5 hours. When the substantial disappearance of the isocyanate was confirmed, 11.6 g of 2-hydroxyethyl acrylate (manufactured by OSAKA ORGANIC CHEMICAL INDUSTRY LTD.) was added dropwise and reaction was performed at 100° C. for 30 minutes. The carboxyl group-containing polyurethane obtained had a number-average molecular weight of 10,400 and an acid value of the solid of 40.3 mg-KOH/g.

[Evaluation]

Solder resist inks were prepared from the carboxyl group-containing polyurethanes of Examples and Comparative Examples as described below. The solder resist inks were cured and the cured products were evaluated for long-term reliability. The results are shown in Table 1.

<Preparation of Solder Resist Inks>

A heat-curable polyurethane resin composition was prepared by using the polyurethane solution (solid concentration: 50% by mass) obtained in Example 1, and adding thereto an epoxy resin (EPIKOTE 828 EL, manufactured by JAPAN EPOXY RESIN CO., LTD.) in an amount such that the epoxy equivalent was 1.1 times the equivalent weight of the carboxyl groups of the polyurethane; melamine as curing catalyst in an amount of 4% by mass relative to 100% by mass of the solid polyurethane; and BYK-051 (manufactured by BYK Chemie Japan K.K.) as anti-foaming agent in an amount of 0.75% by mass relative to 100% by mass of the solid polyurethane. The composition was kneaded by being passed through a three-roll mill (RIII-1 RM-2, manufactured by Kodaira Seisakusho Co., Ltd.) three times. Consequently, a solder resist ink was prepared.

Solder resist inks were prepared in the same manner as described above with the polyurethane solutions (heat-curable polyurethane resin compositions) of Examples 2-5 and Comparative Examples 1-3.

<Long-Term Reliability>

The solder resist ink was applied on an IPC-C (comb-shaped pattern) of a commercially available substrate (IPC standard) by screen printing through a No. 100-mesh polyester plate. The ink was dried at 80° C. for 30 minutes, and cured at 150° C. for 1 hour. The substrate was exposed to 85° C. and 85% RH, and a bias voltage of 100 V was applied to the substrate for 500 hours. The electrical insulating properties were evaluated based on the following criteria.

AA: No migration and no decrease in insulation resistance resulted.

CC: Migration or decreased insulation resistance resulted.

TABLE 1

| | Long-term reliability |
|---|---|
| Ex. 1 | AA |
| Ex. 2 | AA |
| Ex. 3 | AA |
| Ex. 4 | AA |
| Ex. 5 | AA |
| Comp. Ex. 1 | CC |
| Comp. Ex. 2 | CC |
| Comp. Ex. 3 | CC |

INDUSTRIAL APPLICABILITY

The carboxyl group-containing polyurethane of the present invention can find uses in fields such as heat-curable resins with superior flexibility for overcoating flexible circuits, electrical insulating materials such as heat-curable solder resists and interlayer insulation films with superior insulating properties, IC and SLSI sealants, and laminates.

The invention claimed is:

1. A solder resist ink comprising: a carboxyl group-containing polyurethane comprising a structure derived from a polyol compound (B), the polyol compound having 1 to 10 hydroxyl groups and 18 to 72 carbon atoms per molecule,
a solvent that is free of basic compounds and has a boiling point of not less than 120° C., and
an epoxy resin.

2. The solder resist ink according to claim 1, wherein the polyol compound (B) is produced by reducing a polyvalent unsaturated fatty acid derived from an animal or vegetable oil.

3. A solder resist ink produced by reacting:
(A) a polyisocyanate compound;
(B) a polyol compound having 1 to 10 hydroxyl groups and 18 to 72 carbon atoms per molecule; and
(C) a carboxyl group-containing dihydroxy compound (other than the compound (B)).

4. The solder resist ink according to claim 3, wherein the polyurethane is produced by reacting:
the compounds (A), (B) and (C), and a monohydroxy compound (D) (other than the compound (B)) and/or a monoisocyanate compound (E).

5. The solder resist ink according to claim 3, wherein the polyisocyanate compound (A) contains at least 10 mol % relative to the total (100 mol %) thereof of an isocyanate group-containing alicyclic compound of 6 to 30 carbon atoms except the carbon atom in the isocyanate group.

6. The solder resist ink according to claim 3, wherein the polyisocyanate compound (A) is one or a combination of two or more polyisocyanate compounds selected from the group consisting of 1,4-cyclohexane diisocyanate, isophorone diisocyanate, methylenebis(4-cyclohexyl isocyanate), hydrogenated 1,3-xylylene diisocyanate and hydrogenated 1,4-xylylene diisocyanate.

7. The solder resist ink according to claim 1 or 3, wherein the polyol compound (B) is represented by Formula (I):

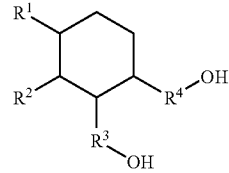

wherein $R^1$ and $R^2$ are the same or different and are each an alkyl group of 3 to 16 carbon atoms, and $R^3$ and $R^4$ are the same or different and are each an alkylene group of 3 to 16 carbon atoms.

8. The solder resist ink according to claim 3, wherein the dihydroxy compound (C) is 2,2-dimethyloipropionic acid or 2,2-dimethylolbutanoic acid.

9. The solder resist ink according to claim 4 wherein the monohydroxy compound (D) is one or a combination of two or more monohydroxy compounds selected from the group consisting of methanol, ethanol, n-propanol, isopropanol, n-butanol, isobutanol, sec-butanol and t-butanol.

10. The solder resist ink according to claim 1 or 3, wherein the polyurethane has a number-average molecular weight of 1,000 to 100,000 and an acid value of 5 to 120 mg-KOH/g.

11. The solder resist ink according to claim 1 or 3, wherein the polyurethane has a number-average molecular weight of 3,000 to 50,000 and an acid value of 10 to 70 mg-KOH/g.

12. The solder resist ink according to claim 1 or 3, wherein the solvent is one or a combination of two or more solvents selected from the group consisting of propylene glycol methyl ether acetate, propylene glycol ethyl ether acetate, dipropylene glycol methyl ether and γ-butyrolactone.

13. A cured product produced by curing the solder resist ink of claim 1 or 3.

* * * * *